United States Patent
Kim et al.

(10) Patent No.: US 9,443,818 B2
(45) Date of Patent: Sep. 13, 2016

(54) POWER SEMICONDUCTOR MODULE

(71) Applicant: SAMSUNG ELECTRO-MECHANICS CO., LTD., Suwon-Si (KR)

(72) Inventors: Kwang Soo Kim, Suwon-Si (KR); Joon Seok Chae, Suwon-Si (KR); Chang Seob Hong, Suwon-Si (KR); Young Hoon Kwak, Suwon-Si (KR); Young Ki Lee, Suwon-Si (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/296,094

(22) Filed: Jun. 4, 2014

(65) Prior Publication Data

US 2015/0214126 A1    Jul. 30, 2015

(30) Foreign Application Priority Data

Jan. 28, 2014    (KR) ........................ 10-2014-0010455

(51) Int. Cl.
| | |
|---|---|
| H01L 23/12 | (2006.01) |
| H01L 23/00 | (2006.01) |
| H01L 25/07 | (2006.01) |

(52) U.S. Cl.
CPC ............... *H01L 24/49* (2013.01); *H01L 24/48* (2013.01); *H01L 25/072* (2013.01); *H01L 2224/48091* (2013.01); *H01L 2224/48227* (2013.01); *H01L 2224/48229* (2013.01); *H01L 2224/49111* (2013.01); *H01L 2224/49113* (2013.01); *H01L 2224/49175* (2013.01); *H01L 2924/00014* (2013.01); *H01L 2924/13055* (2013.01); *H01L 2924/13091* (2013.01)

(58) Field of Classification Search
CPC ............................. H01L 24/49; H01L 23/043
USPC ......................................................... 257/704
See application file for complete search history.

(56) References Cited

U.S. PATENT DOCUMENTS

| | | |
|---|---|---|
| 2013/0001599 A1* | 1/2013 | Lee ................. 257/88 |
| 2013/0105961 A1 | 5/2013 | Jones |
| 2013/0221513 A1 | 8/2013 | Borghoff |

* cited by examiner

*Primary Examiner* — Theresa T Doan
(74) *Attorney, Agent, or Firm* — Ladas & Parry, LLP

(57) ABSTRACT

Disclosed herein is a power semiconductor module. The power semiconductor module includes: a printed circuit board (PCB); first and second heat spreaders mounted on the PCB and having one surface arranged with terminal slots; power devices mounted on the first heat spreader and connected to one another in parallel and electrically connected to the second heat spreader; and first and second terminals provided with protrusion inserted into the terminal slots and provided with connection terminals for connecting external terminals. Therefore, it is possible to improve heat radiating properties of the power semiconductor module and improve a reliability problem such as solder crack or delamination in connection with terminal connection.

10 Claims, 6 Drawing Sheets

POWER SEMICONDUCTOR MODULE

CROSS REFERENCE TO RELATED APPLICATION

This application claims the benefit of Korean Patent Application No. 10-2014-0010455, filed on Jan. 28, 2014, entitled "Power Semiconductor Module" which is hereby incorporated by reference in its entirety into this application.

BACKGROUND OF THE INVENTION

1. Technical Field

The present invention relates to a power semiconductor module.

2. Description of the Related Art

In the power semiconductor module, a high-capacity power semiconductor module uses a plurality of power devices which are connected to each other in parallel, due to a limitation of the power device. That is, according to the power semiconductor module published in (Patent Document 1), the high-capacity power semiconductor module is configured by mounting the plurality of power devices on a base plate and connecting the power devices in parallel to easily accommodate a high-capacity current.

The high-capacity power semiconductor module according to the related art, including the (Patent Document 1) has a problem in that there is a need to uniformly control each power device and the power devices are disposed only in a limited space and a limited number of power devices are connected to each other in parallel due to an unbalance of a heat generation problem between the power devices, and the like.

Therefore, to resolve the heat generation problem of the power device, in addition to a generally used heat radiating substrate, various efforts have been conducted, but do not obtain distinct outcomes.

Meanwhile, in the high-capacity power semiconductor module, terminals which are external terminals are connected to each other by generally using soldering, ultrasonic bonding, or wire bonding, which is disclosed in (Patent Document 1) and (Patent Document 2).

Here, a structure of connecting between the terminals by the soldering has a problem of reliability of bonded portions between the terminals, and uses a reflow process at the time of connecting between the terminals to increase package cost and reduce productivity and a reliability such as remelting of other bonded portions during the reflow process.

Further, similar to the soldering, the structure of connecting between the terminals by the ultrasonic bonding also causes the reliability problem and requires separate equipment for the ultrasonic bonding process and therefore causes an increase in cost in the package process. Further, even when the terminals are connected to each other by the wire bonding, a large current accommodating capacity of the wire bonding is limited and therefore the rating of the power semiconductor module is limited or a lot of wire bonding needs to be performed to make a large current flow, thereby causing the reliability problem, the increase in the package cost, and the like.

PRIOR ART DOCUMENT

Patent Document (Patent Document 1) US2013-0221513 A1
(Patent Document 2) US2013-0105961 A1

SUMMARY OF THE INVENTION

The present invention has been made in an effort to resolve a heat generation problem between power devices and a connection related problem between terminals to increase efficiency of a power semiconductor module and secure high reliability thereof.

Further, the present invention has been made in an effort to provide a power semiconductor module capable of easily improving heat radiating characteristics by using a heat spreader and easily improving reliability by deleting a bonding process between terminals.

According to a preferred embodiment of the present invention, there is provided a power semiconductor module, including: a printed circuit board (PCB); first and second heat spreaders mounted on the PCB and having one surface arranged with terminal slots; power devices mounted on the first heat spreader and connected to one another in parallel and electrically connected to the second heat spreader; and first and second terminals provided with protrusion inserted into the terminal slots and provided with connection terminals for connecting external terminals.

The terminal slots of the second heat spreader may be formed to correspond to the number of power devices and may be alternately disposed to the terminal slots of the first heat spreader.

The power device may be connected to the second heat spreader by wire bonding.

The power device may be connected to the PCB by wire bonding.

The first terminal may be provided with a gate window to prevent interference due to the wire bonding between the power device and the PCB.

According to another preferred embodiment of the present invention, there is provided a power semiconductor module, including: a housing provided with an internal space; a printed circuit board (PCB) disposed in the internal space; first and second heat spreaders mounted on the PCB and having one surface arranged with terminal slots; power devices mounted on the first heat spreader and connected to one another in parallel and electrically connected to the second heat spreader; and first and second terminals having one end provided with protrusions inserted into the terminal slots and provided with connection terminals fitted in slots of the housing to connect an external terminal to on opposite end of the protrusion.

The terminal slots of the second heat spreader may be formed to correspond to the number of power devices and may be alternately disposed to the terminal slots of the first heat spreader.

The power device may be connected to the second heat spreader by wire bonding.

The power device may be connected to the PCB by wire bonding.

The first terminal may be provided with a gate window to prevent interference due to the wire bonding between the power device and the PCB.

According to still another preferred embodiment of the present invention, there is provided a power semiconductor module, including: a housing provided with an internal space; a printed circuit board (PCB) disposed in the internal space; first and second main heat spreaders mounted on the PCB and having one surface arranged with terminal slots; a sub heat spreader disposed on one side of the first main heat spreader and mounted on the PCB and provided with the terminal slot; power devices mounted on the first main heat spreader and connected to one another in parallel and electrically connected to the sub heat spreader and the PCB; power devices mounted on the second main heat spreader and connected to one another in parallel and electrically connected to the PCB; and first, second, and third terminals having one end provided with protrusions inserted into the terminal slots and provided with connection terminals fitted in slots of the housing to connect an external terminal to on opposite end of the protrusion.

The terminal slots of the sub heat spreader may be formed to correspond to the number of power devices and may be alternately disposed to the terminal slots of the first main heat spreader.

The power device of the first main heat spreader may be connected to the sub heat spreader and the PCB by wire bonding.

The power device of the second main heat spreader may be connected to the substrate by wire bonding.

The first terminal may be provided with a gate window to prevent interference due to the wire bonding between the power device of the second main heat spreader and the PCB.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
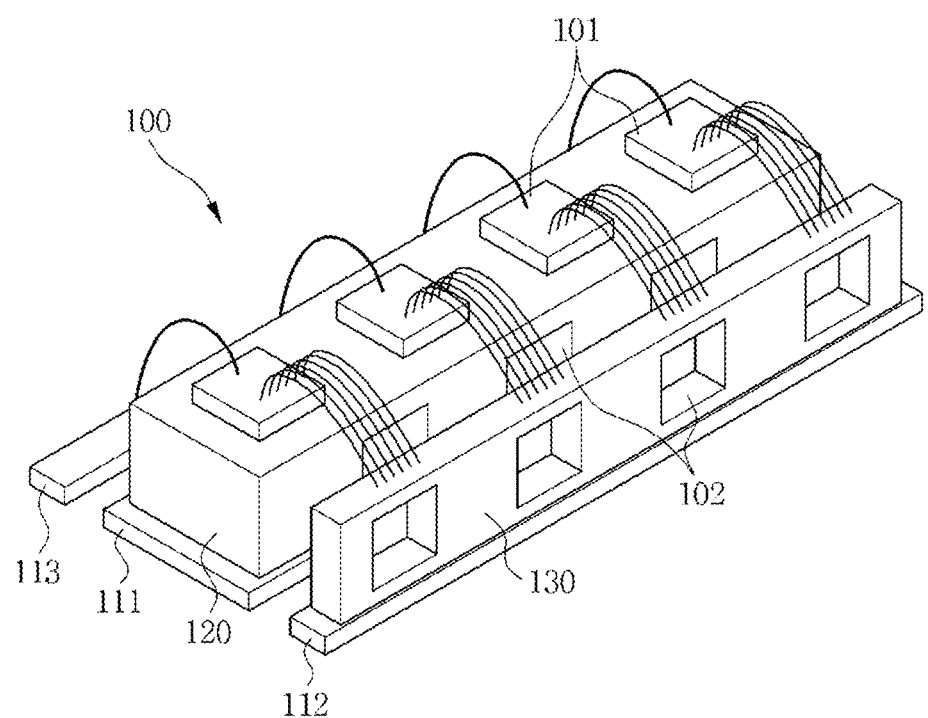
FIG. 1 is a perspective view illustrating a power semiconductor module according to a first preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the accompanying drawings.

A power semiconductor module according to a preferred embodiment of the present invention uses a heat spreader and adopts a solderless structure for connecting terminals, thereby improving heat radiating characteristics of a power semiconductor module and improving reliability.

That is, a market demand for the multi-functional and small power semiconductor module has been gradually increased, and therefore the heat generation problem of electronic components may degrade the overall performance of the power semiconductor module. In particular, in a high-capacity power semiconductor module, a main application field is concentrated on an electricity/industry field, and thus reliability of a module, including environmental reliability and driving reliability has been recognized as one of the important problems.

Therefore, the power semiconductor module according to an embodiment of the present invention uses a heat spreader to increase heat radiating characteristics and, in connecting between terminals which are external terminals to delete a bonding process represented by soldering, a solderless structure based on a method for forming slots on the heat spreader and forming protrusions on the terminals to insert the terminals into the slots or press-fit the terminals in the slots has been applied.

Therefore, in connecting between the terminals, a problem of reliability, such as solder crack or delamination may be improved and a reflow process therefor may be deleted, such that cost in a package process may be reduced and management of productivity may be improved and the problem of reduction in yield and reliability due to remelting of die attach materials during the reflow process may be improved.

Hereinafter, a first preferred embodiment of the present invention is described in detail with reference to the accompanying drawings.

First Preferred Embodiment

Figure 2:
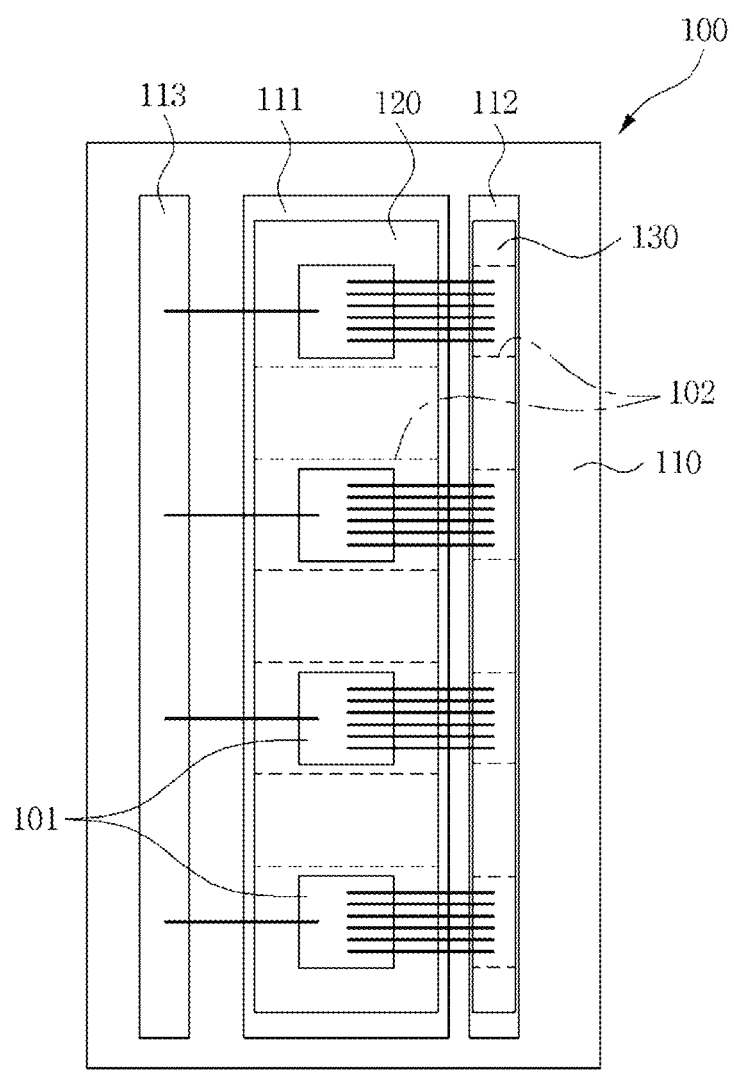
FIG. 2 is a plan view illustrating the power semiconductor module according to the first preferred embodiment of the present invention.

As illustrated in FIGS. 1 and 2, a power semiconductor module 100 according to a first preferred embodiment of the present invention has a structure in which four large-capacity power devices including MOSFET, IGBT, and FRD, and the like are connected to one another in parallel, in which a power device 101 is mounted on a heat spreader having three terminal slots disposed on a side thereof.

The power device 101 has a source part which is electrically connected to another heat spreader which is disposed on one side of the heat spreader and a gate signal terminal is electrically connected to a pattern on a printed circuit board (PCB). As an example of the electrical connection, wire bonding is used.

Here, it is to be noted that the heat spreader and another heat spreader may be divided into a first heat spreader 120 and a second heat spreader 130 to avoid confusion which is caused due to the same term. Further, the second heat spreader 130 has a side provided with four terminal slots 102 which are equal to the number of power devices 101, in which the terminal slots 102 of the second heat spreader 130 are alternately disposed to the terminal slots 102 of the first heat spreader 120.

Further, patterns on which the first and second heat spreaders 120 and 130 on a printed circuit board 110 are mounted are named first and second patterns 111 and 112 and a pattern to which the gate signal terminal of the power device 101 is electrically connected is named a third pattern 113. The first, second, and third patterns 111, 112, and 113 are separately formed on the printed circuit board 110.

Figure 3:
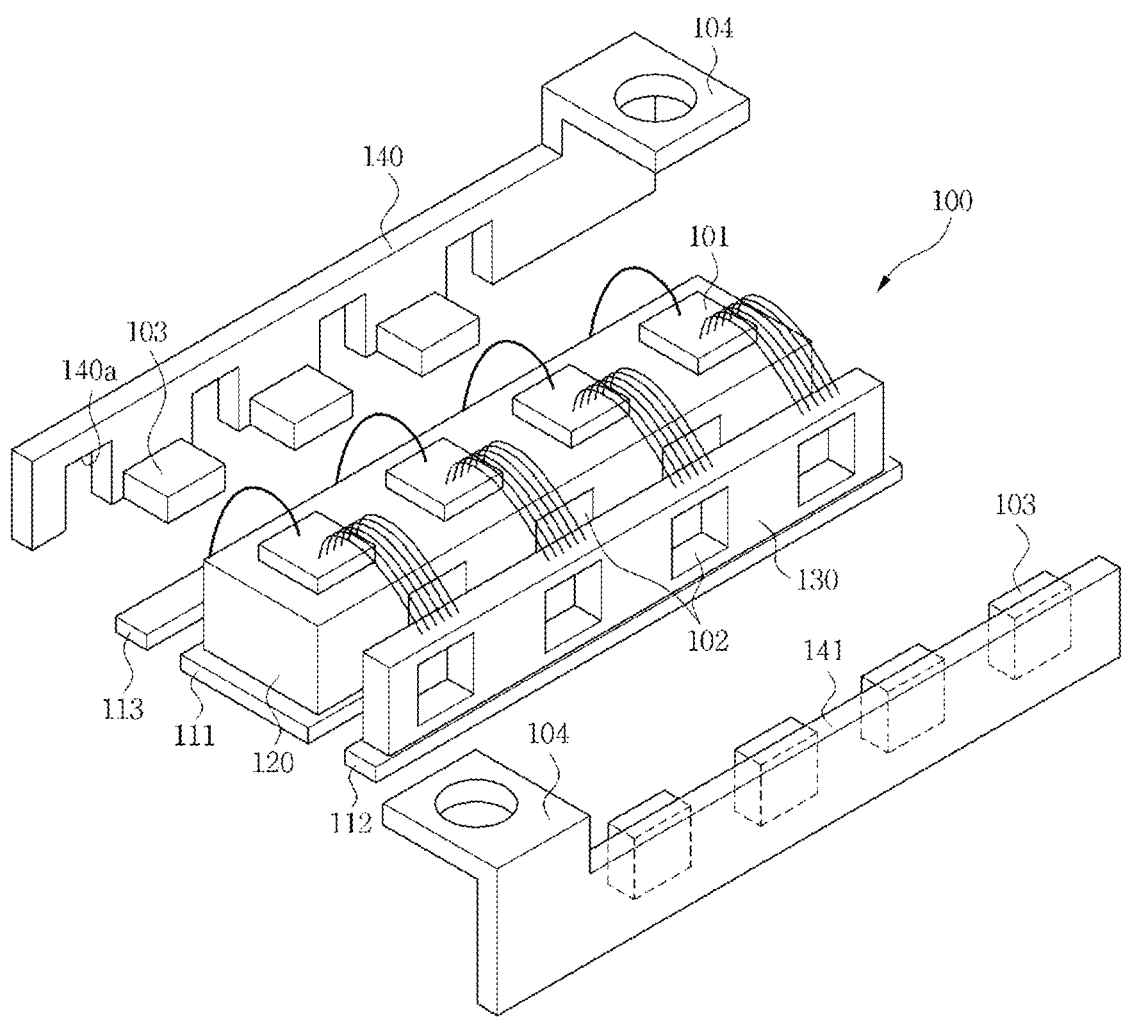
FIGS. 3 and 4 are perspective views illustrating the power semiconductor module according to the first preferred embodiment of the present invention.
Figure 4:
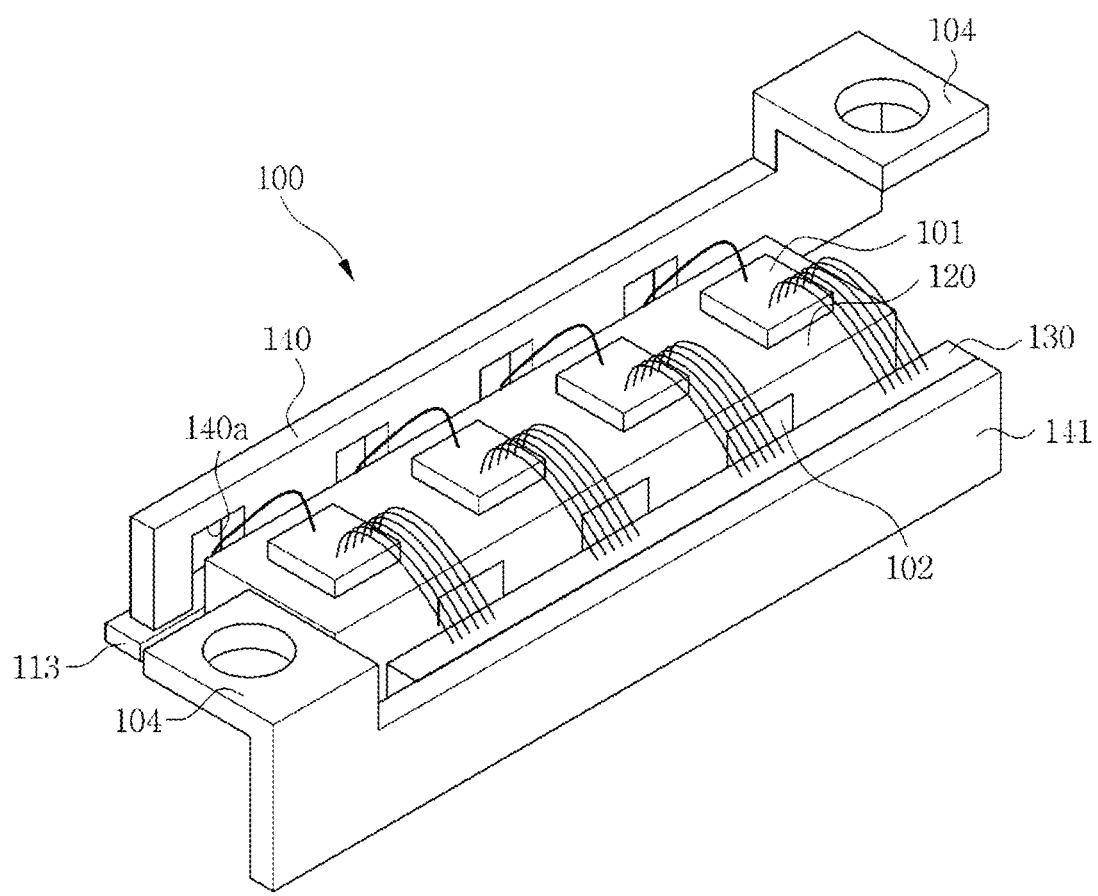

As illustrated in FIGS. 3 and 4, the power semiconductor module 100 from which die attach and wire bonding suffer is connected to terminals as external terminals. As described above, the terminals are connected to each other by the solderless structure.

That is, a lower portion of the terminal is arranged with the protrusions 103 inserted into the terminal slots 102 which are formed on the first and second heat spreaders 120 and 130 and the terminal is formed to have a maximum area so as to reduce resistance, thereby easily accommodating a large-capacity current. Further, an opposite end of the protrusion 103, that is, an upper end in the drawing is provided with a connection terminal 104 for connecting an external terminal.

In this configuration, the terminal is configured to include a first terminal 140 which is disposed on one side of the first heat spreader 120 to insert the protrusions 103 into the terminal slots 102 of the first heat spreader 120 and a second terminal 141 which is disposed on one side of the second heat spreader 130 to insert the protrusions 103 into the terminal slots 102 of the second heat spreader 130.

That is, the power semiconductor module 100 according to the first preferred embodiment of the present invention is easily configured by fitting the first terminal 140 in the first heat spreader 120 on which the power devices 101 are mounted and the second terminal 141 with the second heat spreader 130. In this case, as the fitting method, a method for inserting the protrusions 103 into the terminal slots 102 to directly connect therebetween or a method for press-fitting the protrusions 103 in the terminal slots 102 may be used.

Meanwhile, a lower end of the first terminal 140 is provided with a gate window. That is, a gate window 140*a* is formed on the first terminal 140 to prevent interference due to the wire bonding which electrically connects the third pattern 113 with the power device 101 and may be used as a pattern in a parasitic impedance design in the circuit design.

Second Preferred Embodiment

Figure 5:
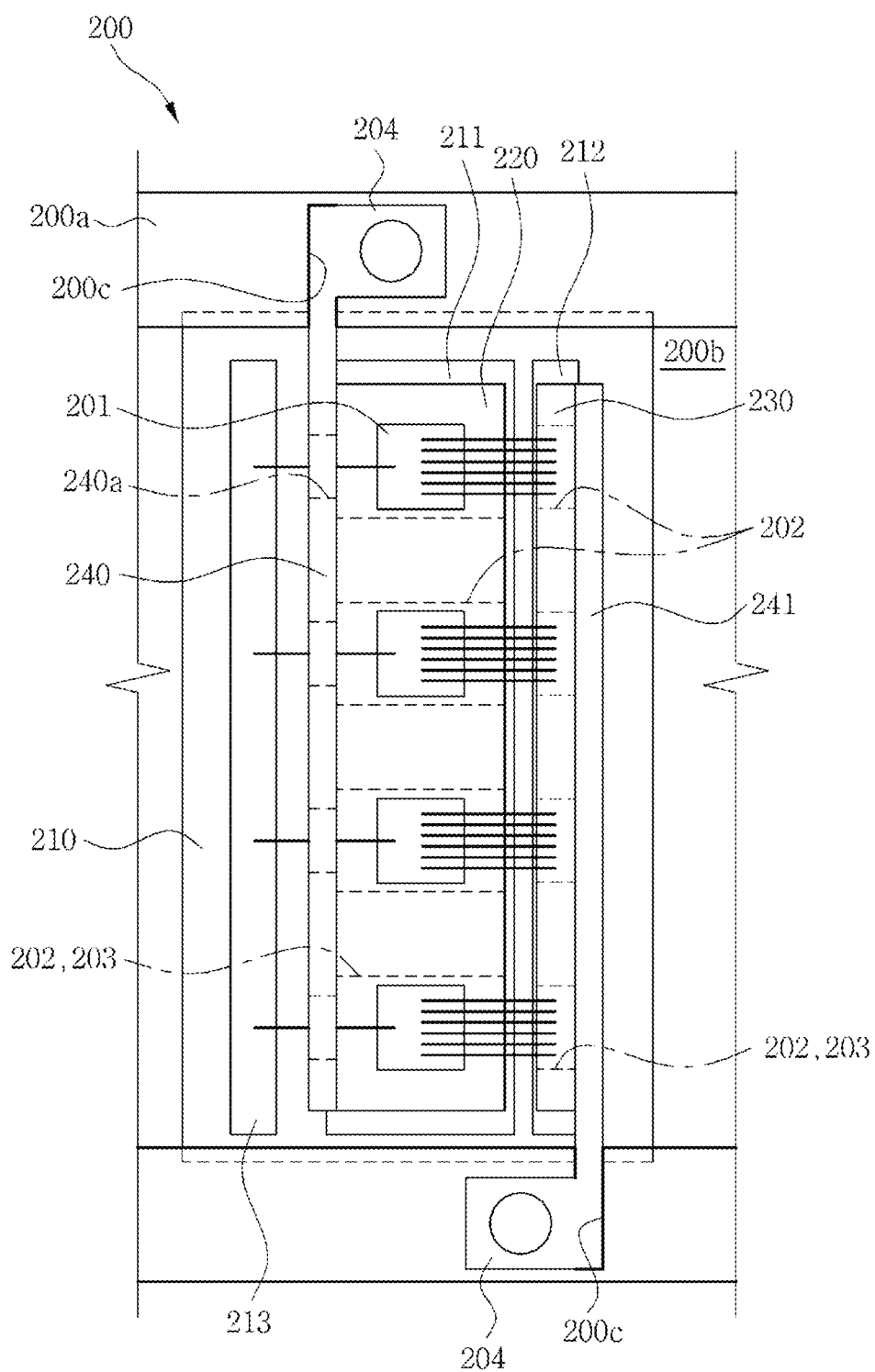
FIG. 5 is a plan view illustrating a power semiconductor module according to a second preferred embodiment of the present invention.

As illustrated in FIG. 5, a power semiconductor module 200 according to a second preferred embodiment of the present invention has a structure in which four large-capacity power devices including MOSFET, IGBT, and FRD, and the like are connected to one another in parallel, in which a power device 201 is mounted on a heat spreader provided with three terminal slots.

The power device 201 has a source part which is electrically connected to another heat spreader which is disposed on one side of the heat spreader and a gate signal terminal is electrically connected to a pattern on the printed circuit board (PCB) which is disposed in an internal space 200*b* of a housing. As an example of the electrical connection, wire bonding is used.

Here, it is to be noted that the heat spreader and another heat spreader may be divided into a first heat spreader 220 and a second heat spreader 230 to avoid confusion which is caused due to the same term. Further, the second heat spreader 230 has one surface provided with four terminal slots 202 which are equal to the number of power devices 201, in which the terminal slots 202 of the second heat spreader 230 are alternately disposed to the terminal slots 202 of the first heat spreader 220.

Further, patterns on which the first and second heat spreaders 220 and 230 on a printed circuit board 210 are mounted are named first and second patterns 211 and 212 and a pattern to which the gate signal terminal of the power device 201 is electrically connected is named a third pattern 213. The first, second, and third patterns 211, 212, and 213 are separately formed on the printed circuit board 210.

The power semiconductor module 200 from which die attach and wire bonding suffer is connected to a terminal as an external terminal. As described above, the terminals are connected to each other by the solderless structure.

That is, the terminal is arranged with the protrusions 203 inserted into the terminal slots 202 which are formed on the first and second heat spreaders 220 and 230 and the terminal is formed to have a maximum area so as to reduce resistance, thereby easily accommodating a large-capacity current. In this configuration, the terminal is configured to include a first terminal 240 which is disposed on one side of the first heat spreader 220 to insert the protrusions 203 into the terminal slots 202 of the first heat spreader 220 and a second terminal 241 which is disposed on one side of the second heat spreader 230 to insert the protrusions 203 into the terminal slots 202 of the second heat spreader 230.

Therefore, the power semiconductor module 200 according to the second preferred embodiment of the present invention is easily configured by fitting the first terminal 240 in the first heat spreader 220 on which the power devices 201 are mounted and the second terminal 241 with the second heat spreader 230. In this case, as the fitting method, a method for inserting the protrusions 203 into the terminal slots 202 to directly connect therebetween or a method for press-fitting the protrusions 203 in the terminal slots 202 may be used.

Ends of the first and second terminals 240 and 241 are provided with connection terminals 204 for connecting external terminals and thus are fitted in slots of a housing which are formed in a housing 200*a*. The connection terminal 204 is inserted into a slot 200*c* of the housing 200*a* and may be fixed by a mechanical fitting method and an adhesive at the time of the insertion.

Meanwhile, the first terminal 240 is provided with a gate window to prevent interference with the power device 201 which is electrically connected to a third pattern 213 by the wire bonding. That is, the gate window 240*a* is formed at one end of the first terminal 240 to prevent the interference due to the wire bonding and may be used as a pattern in a parasitic impedance design in the circuit design.

Third Preferred Embodiment

Figure 6:
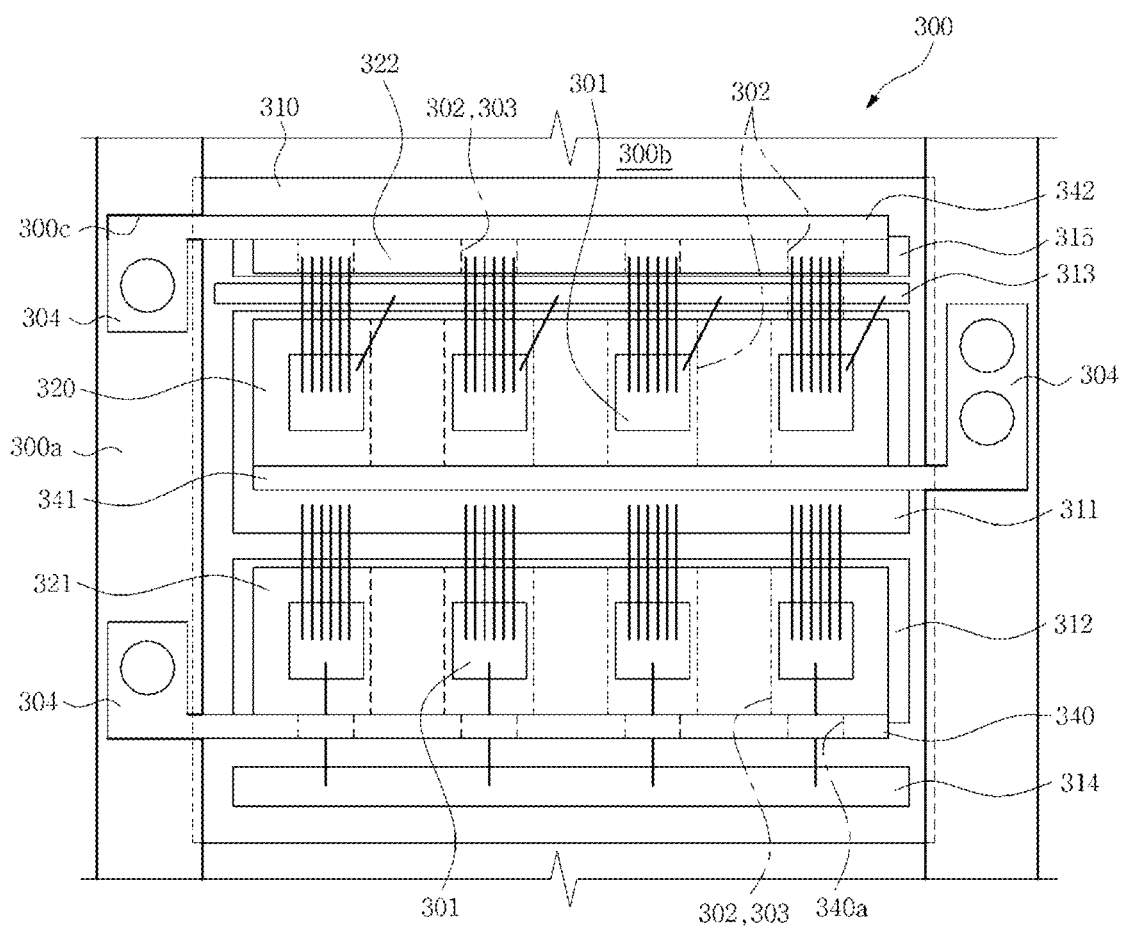
FIG. 6 is a plan view illustrating a power semiconductor module according to a third preferred embodiment of the present invention.

As illustrated in FIG. 6, a power semiconductor module 300 according to a third preferred embodiment of the present invention has a structure in which four large-capacity power devices including MOSFET, IGBT, and FRD, and the like are mounted on a main heat spreader and are connected to one another in parallel. Further, the power semiconductor module 300 has a structure in which four large-capacity power devices 301 are mounted on another main heat spreader and are connected to one another in parallel.

In this configuration, the main heat spreader and the another main heat spreader are be divided into a first main heat spreader 320 and a second main heat spreader 321 to avoid confusion which is caused due to the same term, in which one surface of the first main spreader 320 and one surface of the second main heat spreader 321 are each provided with terminal slots 302.

The power device 301 of the first main heat spreader 320 has a source part which is electrically connected to a sub heat spreader 322 which is disposed on one side of the first main heat spreader 320 and a gate signal terminal is electrically connected to a pattern on the printed circuit board (PCB) which is disposed in an internal space 300*b* of a housing. The sub heat spreader 322 has one surface provided with four terminal slots 302 which are equal to the number of power devices 301, in which the terminal slots 302 of the sub heat spreader 322 are alternately disposed to the terminal slots 302 of the first main heat spreader 320

Meanwhile, the power device 301 of the second main heat spreader 321 has a source part which is electrically connected to a pattern of a printed circuit board 310 on which the first main heat spreader 320 is mounted and a gate signal terminal is electrically connected to a pattern on the printed circuit board 310 which is formed on one side of the second main heat spreader 321 and as an example, the gate signal terminal is connected to the pattern by the wire bonding.

Herein, in connection with the pattern formed on the printed circuit board 310, patterns on which first and second main heat spreaders 320 and 321 are mounted are each named first and second patterns 311 and 312, a pattern to which the power device 301 of the first main heat spreader 320 is connected is named a third pattern 313, and a pattern to which the power device 301 of the second main heat spreader 321 is named a fourth pattern 314. Further, a pattern on which a sub heat spreader 322 is mounted is named a fifth pattern 315 and the first, second, third, fourth, and fifth patterns 311, 312, 313, 314, and 315 are separately formed on the printed circuit board 310.

The power semiconductor module 300 from which die attach and wire bonding suffer is connected to a terminal as an external terminal. As described above, the terminals are connected to each other by the solderless structure.

That is, the terminal is arranged with protrusions 303 inserted into terminal slots 302 which are formed on the first and second main heat spreaders 320 and 321 and the sub heat spreader 322 and is formed to have a maximum area so as to reduce resistance, thereby easily accommodating a large-capacity current.

Herein, the terminal is configured to include a first terminal 340 which is disposed on one side of the second main heat spreader 321 to insert the protrusions 303 into the terminal slots 302 of the second main heat spreader 321, a second terminal 341 which is disposed on one side of the first main heat spreader 320 to insert the protrusions 303 into the terminal slots 302 of the first main heat spreader 320, and a third terminal 342 in which the protrusions 303 are inserted into the terminal slots 302 of the sub heat spreader 322. The first, second, and third terminals 340, 341, and 342 are each analyzed as a P-stage terminal, an output stage terminal, and an N stage terminal.

That is, the power semiconductor module 300 according to the third preferred embodiment of the present invention is easily configured by fitting the first terminal 340 in the second main heat spreader 321, the second terminal 341 in the first main heat spreader 320, and then the third terminal 342 in the sub heat spreader 322. In this case, as the fitting method, a method for inserting the protrusions 303 into the terminal slots 302 to directly connect therebetween or a method for press-fitting the protrusions 303 in the terminal slots 302 may be used.

Ends of the first, second, third terminals 340, 341, and 342 are each provided with connection terminals 304 for connecting external terminals and thus are fitted in slots of a housing which are formed in a housing 300a. The connection terminal 304 is inserted into a slot 300c of the housing 300a and may be fixed by a mechanical fitting method and an adhesive at the time of the insertion.

Meanwhile, an end of the first terminal 340 is provided with a gate window. That is, a gate window 340a is formed on the first terminal 340 to prevent interference due to the wire bonding which electrically connects the fourth pattern 314 with the power device 301 of the second main heat spreader 321 and may be used as a pattern in a parasitic impedance design in the circuit design.

Therefore, according to the power semiconductor module 300 according to the third preferred embodiment of the present invention, in connecting the power device (high side/low side) to the first and second main heat spreaders 320 and 321, respectively, there is additional effects of improving heat radiating characteristics, the overall reduction of size, and the reduction in impedance.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power semiconductor module, comprising:
   a printed circuit board (PCB);
   a first heat spreader and a second heat spreader mounted on the PCB and having surfaces arranged with terminal slots;
   power devices mounted on the first heat spreader and connected to one another in parallel and electrically connected to the second heat spreader;
   a first terminal provided with protrusions to be inserted into each of the terminal slots of the first heat spreader and provided with a connection terminal for connecting to an external terminal; and
   a second terminal provided with protrusions to be inserted into each of the terminal slots of the second heat spreader and provided with a connection terminal for connecting to an external terminal,
   wherein the first terminal and the second terminal are electrically connected to the first heat spreader and the second heat spreader by the protrusions.

2. The power semiconductor module as set forth in claim 1, wherein the terminal slots of the second heat spreader are formed to correspond to the number of power devices and are alternately disposed to the terminal slots of the first heat spreader.

3. The power semiconductor module as set forth in claim 1, wherein the power device is connected to the second heat spreader by wire bonding.

4. The power semiconductor module as set forth in claim 1, wherein the power device is connected to the PCB by wire bonding.

5. The power semiconductor module as set forth in claim 4, wherein the first terminal is provided with a gate window to prevent interference due to the wire bonding between the power device and the PCB.

6. A power semiconductor module, comprising:
   a housing provided with an internal space;
   a printed circuit board (PCB) disposed in the internal space;
   a first heat spreader and a second heat spreader mounted on the PCB and having one surface arranged with terminal slots;
   power devices mounted on the first heat spreader and connected to one another in parallel and electrically connected to the second heat spreader;

a first terminal having one end provided with protrusions to be inserted into each of the terminal slots of the first heat spreader and provided with a connection terminal fitted in slot of the housing to connect an external terminal to an opposite end of the protrusions; and a second terminal having one end provided with protrusions to be inserted into each of the terminal slots of the second heat spreader and provided with a connection terminal fitted in slots of the housing to connect an external terminal to on opposite end of the protrusions, wherein the first terminal and the second terminal are electrically connected to the first heat spreader and the second heat spreader by the protrusions.

7. The power semiconductor module as set forth in claim 6, wherein the terminal slots of the second heat spreader are formed to correspond to the number of power devices and are alternately disposed to the terminal slots of the first heat spreader.

8. The power semiconductor module as set forth in claim 6, wherein the power device is connected to the second heat spreader by wire bonding.

9. The power semiconductor module as set forth in claim 6, wherein the power device is connected to the PCB by wire bonding.

10. The power semiconductor module as set forth in claim 9, wherein the first terminal is provided with a gate window to prevent interference due to the wire bonding between the power device and the PCB.

* * * * *